US 8,549,456 B2

(12) United States Patent
Roy et al.

(10) Patent No.: US 8,549,456 B2
(45) Date of Patent: Oct. 1, 2013

(54) SYSTEM AND METHOD FOR CIRCUIT DESIGN FLOORPLANNING

(75) Inventors: Sanghamitra Roy, Logan, UT (US); Koushik Chakraborty, Logan, UT (US); Yiding Han, Logan, UT (US)

(73) Assignee: Utah State University, Logan, UT (US)

( * ) Notice: Subject to any disclaimer, the term of this patent is extended or adjusted under 35 U.S.C. 154(b) by 142 days.

(21) Appl. No.: 13/013,654

(22) Filed: Jan. 25, 2011

(65) Prior Publication Data

US 2011/0185328 A1    Jul. 28, 2011

Related U.S. Application Data

(60) Provisional application No. 61/298,259, filed on Jan. 26, 2010.

(51) Int. Cl.
*G06F 17/50*    (2006.01)
(52) U.S. Cl.
USPC .......................................... 716/123; 716/118
(58) Field of Classification Search
USPC ................... 716/122, 50, 118, 123; 712/225; 718/107
See application file for complete search history.

(56) References Cited

U.S. PATENT DOCUMENTS

| 2007/0085583 A1* | 4/2007 | Zohar ........................... 327/178 |
| 2010/0218196 A1* | 8/2010 | Leung et al. ................... 718/107 |
| 2010/0251202 A1* | 9/2010 | Pierrat ............................ 716/20 |
| 2011/0138157 A1* | 6/2011 | Ni et al. ........................ 712/225 |

OTHER PUBLICATIONS

Han, et.al., Design and Implementation of a Throughput-Optimized GPU Floorplanning Algorithm, ACM Transactions on Design Automation of Electronic Systems, Jun. 23-23, 2011:21, vol. 16, No. 3, Article 23.

* cited by examiner

*Primary Examiner* — Vuthe Siek
*Assistant Examiner* — Mohammed Alam

(57) ABSTRACT

Circuit floorplanning is performed on a combination central processing unit and multiprocessor. A B*-tree data structure of a floorplan and circuit related constants reside in a central processing unit data storage. The B* tree structure of a floorplan along and said circuit related constants are copied to a multiprocessor data storage where multiple thread blocks, each consisting of a single thread, copy the tree to their own shared memories. The multiprocessor concurrently evaluates different moves in different thread blocks. The multiprocessor then evaluates objective function results and stores those results. The best result for floorplanning is selected from the multiple circuit evaluations.

19 Claims, 3 Drawing Sheets

SYSTEM AND METHOD FOR CIRCUIT DESIGN FLOORPLANNING

RELATED APPLICATIONS

This application claims the benefit under 35 U.S.C. §119 (e) of U.S. Provisional Patent Application No. 61/298,259, filed Jan. 26, 2010, and titled "Floorplanning Using Graphical Processor Units" which is incorporated herein by reference.

TECHNICAL FIELD

The present invention relates to electronic design automation systems for circuit design floorplanning.

BACKGROUND

Electronic Design Automation (EDA) industry has gone through major development in process designs over the past several decades, delivering improved and more sophisticated design tools. Today, these tools provide the critical platform for modern IC designs composed of multi-billion transistors. However, most of these processes, although showcasing tremendous improvements in their capabilities, are based on a sequential Von Neumann machine, with limited or no ability to exploit concurrency. While such limitation did not pose any significant end effect in the past, the advent of commodity multicores created a need to embrace concurrency in many fields, including EDA applications. This need is fast gaining urgency with the trends in Graphics Processor Units (GPUs) development.

GPUs are inherently concurrent designs, with several hundreds of processing units within a single GPU. They not only demonstrate tremendous computation bandwidth (orders of magnitude improvement from commodity multicores), but also the ability to allow non-graphics applications to harness their computing prowess. It is the latter development that will make significant impact in EDA algorithms, as algorithms designed for GPUs in the next decade are poised to bear little resemblance to the existing body of EDA tools. We disclose a novel floorplanning process designed to exploit the GPUs.

Exploiting the tremendous computation bandwidth in a sequential process such as floorplanning is non-trivial. The computation bandwidth in GPUs is geared towards single-instruction multiple thread (SIMT) style data parallel code. The sequential floorplanning process progresses by repeatedly applying a random move on the floorplan, and modifying the floorplan based on the acceptance of the move. A typical run will evaluate thousands of moves, creating a long chain of dependencies (both control and data). This dependency chain must be broken to completely restructure the process for efficient mapping onto a GPU, while preserving the solution quality.

Compute intensive processes like fault simulation, power grid simulation and event-driven logic simulation have been successfully mapped to GPU platforms to obtain significant speedups. One key similarity in all these previous works is the presence of a fixed common topology/data structure across parallel threads that are fed with separate attributes for concurrent evaluation (e.g. distinct gate sizes and threshold voltages for a single circuit topology, distinct input patterns for a single circuit). The unmodified topology is highly amenable to the SIMT style in GPUs, as it does not require frequent data modification and reuse. In contrast, the floorplanning process that we target poses a severe challenge to SIMT style platforms, as it involves a chain of dependent modifications to the data structures.

DETAILED DESCRIPTION OF THE INVENTION

With VLSI designs becoming increasingly complex, the floorplanning stage of physical design is critical in determining the quality of design. Typically, a large number of candidate floorplans are evaluated before converging to a good solution. Therefore, one of the critical design issues is choosing an efficient data structure for floorplan representation, which can ease the operations and management of floorplans. Among several alternatives, one of the most widely adopted representations is a B* tree. B* tree is an ordered binary tree data structure in which nodes are kept ⅔ full by redistributing keys to fill two child nodes, then splitting them into three nodes. O-tree (ordered tree) is a tree data structure where the children of every node are ordered, that is, there is a first child, second child, third child, etc. In floorplanning, B*tree and O-tree are both used to represent non-slicing floorplans for any admissible placement. B* tree is an ordered binary tree data structure that inherits all desirable properties from the O tree and comes with additional advantages. While handling non-slicing floorplans, the B* tree overcomes the irregularity in tree structure, typical in O trees. B* tree has a 1-1 correspondence with its admissible placement—a compacted placement, where individual modules cannot move down or left. This attributes certainty to the operational complexity involved with B* trees and enables flexible realization allowing usage of either static or dynamic memory structure. On choosing a static structure, operations like insertion, deletion and search can be done in linear time.

Typically, simulated annealing—a generic probabilistic optimization algorithm—is applied on the B* tree for floorplanning. The different moves that can explore the entire solution space in a simulated annealing based floorplanning process using B* trees are: (a) rotating a module; (b) moving a module to a new location; and (c) swapping two modules. Each of the three moves are primarily based on the insertion and deletion operations of the B* tree data structure, which automatically preserves the validity of the new floorplan.

Figure 1:
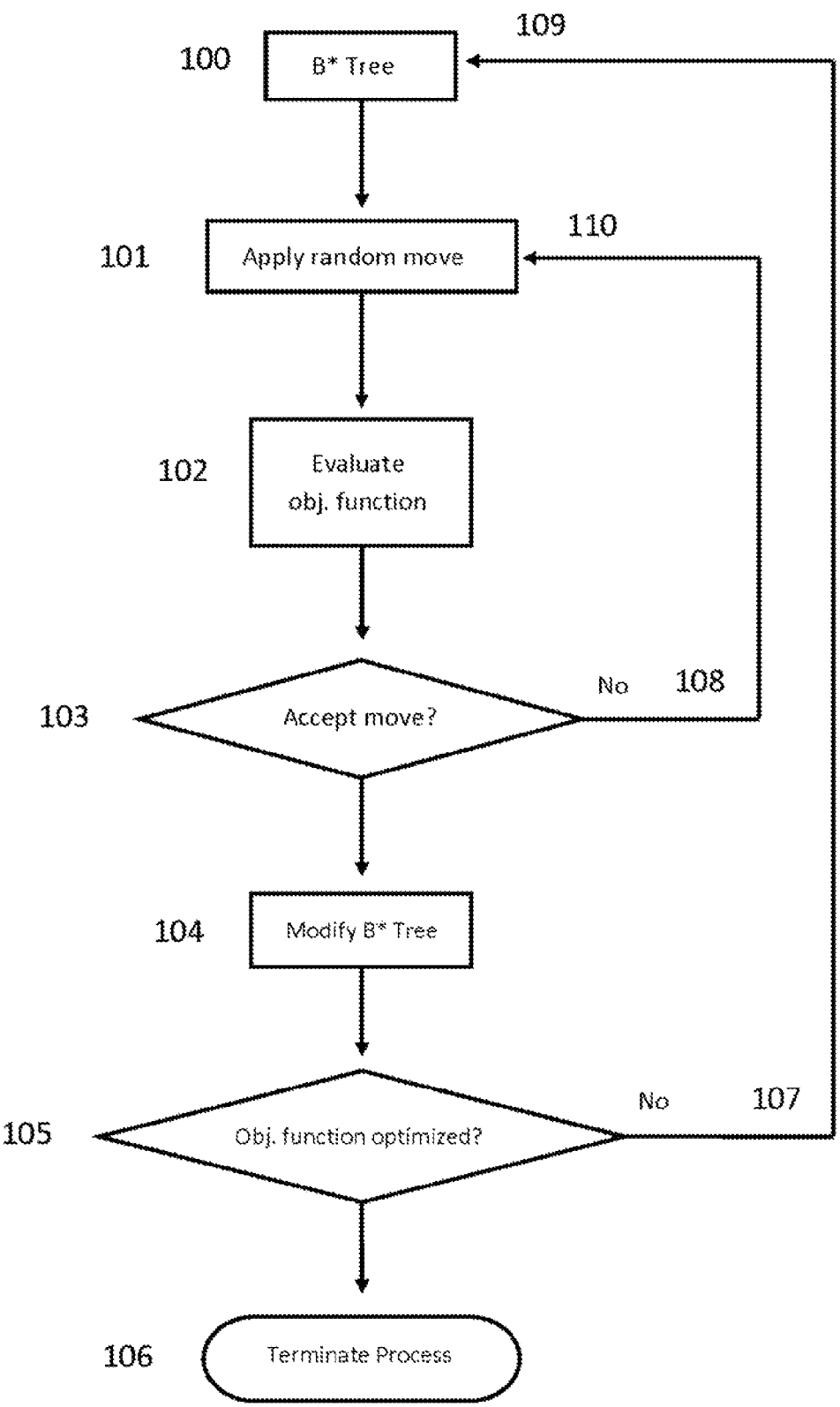
FIG. 1: Floorplanning in CPU

FIG. 1 illustrates the simulated annealing algorithm using a B* tree. The algorithm starts with an initial B* tree 100 representation of the floorplan and randomly chooses and applies one of the three moves to the tree 101. Next, the objective of the newly generated B* tree (area and/or wirelength) is evaluated 102 and 103 the move is accepted 104, 105 or rejected 108, 110 based on the simulated annealing schedule. These steps are repeated several, times 107, 109 until a satisfactory solution is obtained 106.

A GPU is a massively multithreaded multiprocessor system that excels in Single-Instruction Multiple-Thread (SIMT) style concurrency. Threads in a GPU are organized in a two-level hierarchy. The lower level consists of a group of programmer specified threads forming a block 308. The higher level consists of a collection of blocks forming a grid 307. The GPU hardware facilitates extremely fast context-switching between threads, thereby allowing efficient overlap of long latency operations of one thread with computations from another. For NVIDIA GPUs, the CUDA (Compute Unified Device Architecture) programming model provides a platform for non-graphics applications to exploit the computation bandwidth of the GPU.

The key to effectively using the CUDA interface is understanding the memory hierarchy of a GPU. The GPU memory hierarchy consists of: (a) device or global memory 310, (b) shared memory 309; and (c) texture memory. Unlike in commodity multicore systems, programmers can explicitly manage data in these memories. Carefully managing the program data structures in these memory modules is paramount for speeding up applications using the GPU.

The Device memory 310 is the global memory for the GPU, which is accessible from all the GPU threads, as well as the CPU. It has high access bandwidth but its access latency is high. Shared memory 309 is the local memory that is shared by all the threads in a block. Therefore, changes made in this memory are visible to all the threads within a block, but invisible to other blocks. Its access latency is low, but its storage space is limited, usually 16 KB per block. Texture memory is for explicitly declared read-only data, and is accessible to all threads. Since it is also automatically cached, the latency of accessing such memory is low.

At a high-level, the CPU uses the GPU as an accelerator for a specific function, known as the kernel function. The CPU typically will send a kernel function to the GPU, along with data for manipulation. All threads execute the same kernel function. However, depending on the kernel specification, different threads may perform different data manipulation as desired by the programmer.

To parallelize the floorplanning process, it is essential to break the dependency chain. Analyzing the general sequential framework from FIG. 1, we observe that we can apply multiple concurrent moves on a given floorplan 201. Fundamentally, this strategy breaks the dependency chains in the sequential process, and explores the solution space in a completely different manner 202, 203, 204.

Figure 2:
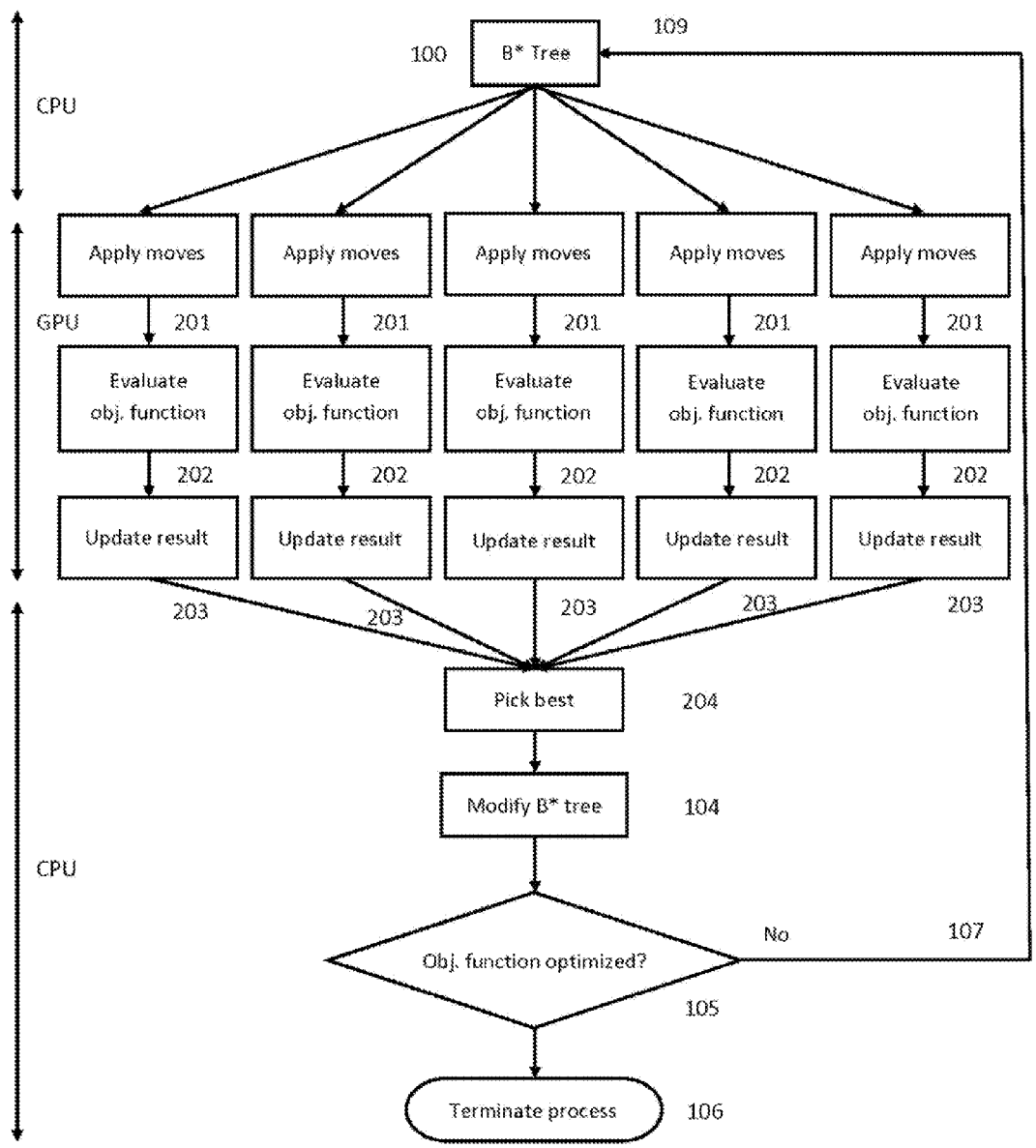
FIG. 2: Floorplanning in CPU-GPU

FIG. 2 presents a high-level overview of a parallel floorplanning process. The initial floorplan represented as a B* tree 100 is selected in the CPU. Several concurrent GPU threads are then launched 201, after copying the necessary state from the CPU to the GPU. Each parallel GPU thread applies a separate move 201, and evaluates the objective function 202 for the resulting floorplan. Consequently, several moves are concurrently evaluated in the GPU. The CPU then inspects the objective evaluations, and accepts one of the moves evaluated during the concurrent phase 203, 204. The process repeats these steps 104, 105, 107, 109 unless a stopping criteria is met 106.

One embodiment of the process proceeds according to the following flow:
Input:
1. A given circuit with n modules
Output:
1. A floorplan that optimizes objective (area, wirelength)
Begin
1. Read input circuit
2. Construct initial floorplan in a B* tree form
3. while stopping criteria not met do
4. Copy tree and attributes to GPU device memory
5. Launch B parallel thread blocks
6. Copy tree and attributes to shared memory
7. Select and perform move
8. Modify tree/*local copy in shared memory*/
9. Evaluate objective
10. Write objective in GPU device memory
11. Copy B objectives from GPU device memory to host memory
12. Pick best move
13. Modify tree with best move
14. end/*end while loop*/
End The initial phase is executed on the CPU. The CPU creates an initial B* tree 100 implementation and copies 312 the B* tree 100 and its attributes 301 to the GPU device memory 310, 303, 304. The CPU subsequently launches N parallel thread blocks in the GPU 201.

The next phase is the concurrent phase in the GPU. Each block copies the B* tree to its own shared memory 306. Since the tree is modified in place (shared memory) when a move is applied, only one thread can perform a move within a thread block. After computing the new floorplan, this thread evaluates the objective of the updated floorplan 315 and stores 305 the objective in the device memory 310.

Finally, in the last phase, the N objectives are copied back from the device memory to the host memory 313. The CPU now picks the best move from the candidate objectives, and makes a single update on its B* tree applying the best move. The process is repeated until the stopping criteria are satisfied. The stopping criteria used may be identical to the sequential version (exploring a fixed number of moves that depend on the number of modules).

Figure 3:
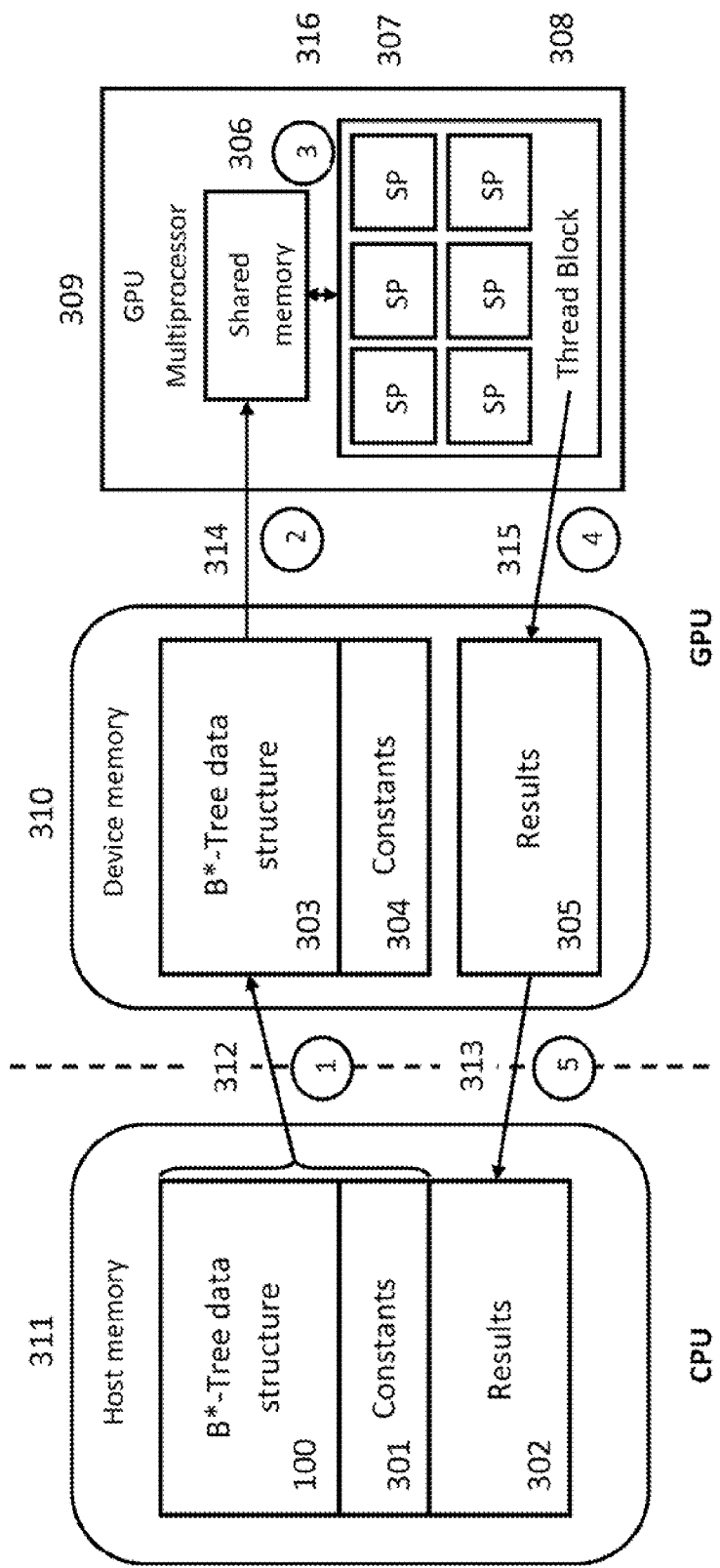
FIG. 3: Dataflow between CPU and GPU.

FIG. 3 shows the dataflow between the CPU (host) and the GPU (device). The B* tree 100 structure of a floorplan along with a few circuit related constants 301 are IS copied 312 to the device memory 303, 304. The constants 301 consist of details of a module (e.g., width, height) that do not change during the entire runtime. Subsequently, multiple thread blocks, each consisting of a single thread, copy the tree to their own shared memories concurrently. Different moves are explored 307 in different thread blocks, and the objective function is evaluated and stored in the device memory 315, 305. Finally, the objective results are copied back to the host memory 313, 302.

Two example hardware platforms are: (1) a 2.40 GHz Intel Core 2 Quad Q6600 Kentsfield processor with a NVIDIA GeForce GTS 250 G92 GPU; and (2) a 2.27 GHz Intel Xeon E5520 Nehalem-EP processor with 4 NVIDIA Tesla C1060 GPUs. For example, CUDA 2.3 SDK may be used for GPU implementations. For example the NVIDIA GPU driver version is 190.18 beta.

For comparison the Parquet Floorplanner from the UMpack suite of VLSI-CAD tools is used as the sequential version of floorplanning. The GPU version is implemented by suitably modifying this code to incorporate both process transformations as well as GPU specific CUDA code. The run time of the floorplanning program can be used as a benchmark to evaluate the efficiency of the process. A CPU timer may be used to measure the distribution of total time spent in CPU and GPU. Within the GPU, the GPU timers can be used to measure time spent in different execution stages.

We run each benchmark several times, and record the best run for both the processes. The number of blocks in each floorplan, indicates the size of the floorplan. For each benchmark, we measure the execution time of the sequential CPU version and the speedup achieved using our parallel GPU implementation on two different machines. Additionally, we also measure the relative quality of the solution achieved in GPU, compared to the CPU. Without loss of generality, in one embodiment we only consider the area of the floorplan as our objective function. IN other embodiments the process can be modified to account for other objectives such as wirelength and temperature. In one embodiment we measure the quality by comparing the area of the floorplan resulting from the two process versions.

The parallel GPU floorplanner shows promising speedup compared to the sequential version. For example, hp and apte show 31% and 27% speedup, respectively.

To take a closer look at different execution components within the GPU, we divide the kernel execution run time into another four parts:
1. Device to shared memory copy
2. B* tree move
3. Objective evaluation
4. Write to device memory Interestingly, we notice that most of time in GPU kernel is spent in copying data from the device memory to shared memory (97%). Time spent to perform the computation to evaluate the objective function for the newly generated floorplan constitute 3% of the total runtime. This indicates that optimizing data copy from the GPU device memory to the shared memory is likely to give substantial benefits. Several techniques were used for optimizing the GPU floorplanning process, all of them targeting the time to copy data from the device memory to the shared memory.

Shared memory allows very fast operations, and it is generally beneficial to copy all the accessory data structures that remain unchanged, to the shared memory. However, many of these data structures are accessed infrequently during evaluating a candidate move. In the context of floorplanning, the additional latency of infrequent access to the device memory for these data items is substantially lower than the cost incurred to copy them to the shared memory.

When applying a move on a floorplan, the B* tree representation of the floorplan is modified in the shared memory. As a result, we only use one thread per block to perform the move and subsequent objective evaluation. However, when copying data from the device memory to the shared memory, we can employ multiple threads in a block to concurrently copy data items. Although device memory access is slow, its bandwidth is very high in a GPU, thereby easily accommodating concurrent thread accesses.

In one embodiment we concurrently copy data from device memory to the shared memory. During the copy phase, each thread block employs several con-current threads to copy the data. After the copy phase, only one thread performs the necessary computation for evaluating a move on the floorplan. The number of threads utilized to perform this copy has an impact on the speedup achieved through this technique.

There is a tradeoff between number of threads and speedup achieved. As the number of threads is increased, concurrent device memory access is increased, leading to a speedup. However, after a certain point, the device memory bandwidth is saturated, and adding more threads does not lead to additional speedup. G92 machine shows maximum relative speedup with 32 threads (37%), while the Tesla C1060 shows maximum speedup with 256 threads. The latter supports higher memory bandwidth, thereby showing better speedup with higher threads than G92.

One way to exploit the high bandwidth from the device memory is to coalesce memory accesses. Such memory accesses happen when half warp (16 threads) accesses a contiguous region of device memory, in which case 16 data elements can be loaded in one instruction. Each of such coalesced memory access retrieves data from different memory banks in parallel, thereby reducing the time to copy data from the device memory to the shared memory. Tree data structure is restructured and access pattern to the optimum coalesce memory accesses.

Each implementation gives significant speedup, but combining them together gives dramatic speedup. For example, ami49 achieves an overall speedup of nearly 17× in the Tesla machine, compared to the sequential version. Larger circuits yield greater speedup, as the data copy cost is better amortized by concurrently computing costlier move operations.

Across the range of circuits, the current GPU floorplan implementation achieves 9.4-14.6× and 10-17× speedups on G92 and Tesla C1060 machines, respectively. Given the long dependency chains and iterative nature of the original sequential process, these improvements are significant.

The above description discloses the invention including preferred embodiments thereof. The examples and embodiments disclosed herein are to be construed as merely illustrative and not a limitation of the scope of the present invention in any way. It will be obvious to those having skill in the art that many changes may be made to the details of the above-described embodiments without departing from the underlying principles of the invention.

The invention claimed is:

1. A system comprising:
    a central processing unit with global data storage constructing a B*-tree data structure comprising an array of modules defining a floorplan of a circuit and storing the B*-tree data structure in the global data storage;
    a multiprocessor comprising a plurality of thread blocks each executing a single thread, and shared memory for each thread block;
    each thread block concurrently copying the B*-tree data structure to each thread block's own shared memory, applying a separate move to modify each B*-tree data structure for each thread block, and calculating an objective function result for each modified B*-tree data structure of each thread block, wherein the objective function result is an area of the floorplan;
    the central processing unit selecting a first objective function result satisfying a first criteria of a simulated annealing algorithm and applying a first move of the first objective function result to the B*-tree data structure stored in the global data storage.

2. The system of claim 1 wherein the multiprocessor is a massively multithreaded multiprocessor system performing Single-Instruction Multiple-Thread style concurrency.

3. The system of claim 1 wherein the multiprocessor is a Graphical Processing Unit.

4. The system of claim 1, the B*-tree data structure further comprising circuit related constants comprising a module width that does not change during an entire runtime.

5. The system of claim 1 the B*-tree data structure further comprising circuit related constants comprising a module height that does not change during an entire runtime.

6. The system of claim 1 wherein at least one move comprises rotating a module of the array of modules.

7. The system of claim 1 wherein at least one move comprises moving a module of the array of modules to a new location.

8. The system of claim 1 wherein at least one move comprises swapping two modules of the array of modules.

9. The system of claim 1 wherein each move preserves a validity of the floorplan for each B*-tree data structure.

10. The system of claim 1 wherein the first criteria is satisfied for a best area.

11. The system of claim 10 wherein the first criteria is satisfied for the best area and a best wirelength.

12. A method for floorplanning a circuit comprising:
    constructing, using a central processing unit, a B*-tree data structure comprising an array of modules defining a floorplan of the circuit;
    storing the B*-tree data structure in a global data storage of the central processing unit;
    concurrently copying, using a plurality of thread blocks of a multiprocessor, the B*-tree data structure to each thread block's own shared memory;

applying a separate move to modify each B*-tree data structure for each thread block;

calculating an objective function result for each modified B*-tree data structure of each thread block, wherein the objective function result is an area of the floorplan;

selecting a first objective function result satisfying a first criteria of a simulated annealing algorithm; and applying a first move of the first objective function result to the B*-tree data structure stored in the global data storage.

13. The method of claim 12 wherein the first criteria is satisfied for a best area.

14. The method of claim 13 wherein the first criteria is satisfied for the best area and a best wirelength.

15. The method of claim 12 wherein at least move comprises rotating a module of the array of modules.

16. The method of claim 12 wherein at least one move comprises moving a module of the array of modules to a new location.

17. The method of claim 12 wherein at least one move comprises swapping two modules of the array of modules.

18. The method of claim 12 wherein each move preserves a validity of the floorplan for each B*-tree data structure.

19. The method of claim 12 wherein the first criteria comprises a probabilistic optimization algorithm.

* * * * *